US012662753B2

(12) United States Patent (10) Patent No.: US 12,662,753 B2
Kim et al. (45) **Date of Patent: *Jun. 23, 2026**

(54) INGOT GROWING APPARATUS

(71) Applicants: HANWHA SOLUTIONS CORPORATION, Seoul (KR); HANWHA CORPORATION, Seoul (KR)

(72) Inventors: Keun Ho Kim, Seoul (KR); Kyung Seok Lee, Seoul (KR); Jin Sung Park, Seoul (KR); Young Jun Lee, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 282 days.

This patent is subject to a terminal disclaimer.

(21) Appl. No.: 18/246,524

(22) PCT Filed: Sep. 3, 2021

(86) PCT No.: PCT/KR2021/011955
§ 371 (c)(1),
(2) Date: Mar. 24, 2023

(87) PCT Pub. No.: WO2022/065741
PCT Pub. Date: Mar. 31, 2022

(65) Prior Publication Data
US 2023/0366124 A1 Nov. 16, 2023

(30) Foreign Application Priority Data
Sep. 24, 2020 (KR) ........................ 10-2020-0124115

(51) Int. Cl.
*C30B 29/06* (2006.01)
*C30B 15/12* (2006.01)
*C30B 15/30* (2006.01)

(52) U.S. Cl.
CPC .............. *C30B 29/06* (2013.01); *C30B 15/12* (2013.01); *C30B 15/30* (2013.01); *Y10T 117/10* (2015.01)

(58) Field of Classification Search
CPC ......... C30B 15/02; C30B 15/12; C30B 15/30; C30B 29/06; Y10T 117/10
See application file for complete search history.

(56) References Cited

U.S. PATENT DOCUMENTS 5,492,078 A 2/1996 Alterkruger
6,423,137 B1 * 7/2002 Takase .................... C30B 15/02
117/34

FOREIGN PATENT DOCUMENTS

CN 102418140 A 4/2012
CN 105452542 A 3/2016
(Continued)

OTHER PUBLICATIONS

CN Office Action dated Nov. 30, 2024.
Office Action issued by the Intellectual Property INDIA on Mar. 19, 2026.

*Primary Examiner* — Hua Qi
(74) *Attorney, Agent, or Firm* — Harvest IP Law, LLP

(57) ABSTRACT

Disclosed is an ingot growing apparatus. An ingot growing apparatus according to an embodiment of the present invention includes a growth furnace in which a main crucible is disposed, wherein the main crucible accommodates molten silicon and is rotated clockwise or counterclockwise to rotate the molten silicon clockwise or counterclockwise in order to grow an ingot, a susceptor formed to surround an outer surface of the main crucible and rotated in the same (Continued)

direction as the main crucible, and a preliminary melting unit which receives a solid silicon material, melts the solid silicon material into molten silicon, and supplies the molten silicon to the main crucible, wherein the preliminary melting unit includes a preliminary crucible which accommodates the molten silicon, and the preliminary crucible supplies the molten silicon contained in the preliminary crucible to the main crucible in a direction in which the molten silicon contained in the main crucible rotates.

11 Claims, 9 Drawing Sheets

(56)                    References Cited

FOREIGN PATENT DOCUMENTS

| | | | | |
|---|---|---|---|---|
| CN | 213507164 | U | * | 6/2021 |
| CN | 215366062 | U | | 12/2021 |
| JP | 09255470 | A | * | 9/1997 |
| JP | 11-092276 | A | | 4/1999 |
| JP | 2003201197 | A | * | 7/2003 |
| JP | 2013-129551 | A | | 7/2013 |
| KR | 10-2001-0020314 | A | | 3/2001 |
| KR | 10-2018-0051827 | A | | 5/2018 |
| KR | 10-2271710 | B1 | | 6/2021 |

* cited by examiner

INGOT GROWING APPARATUS

CROSS-REFERENCE TO RELATED APPLICATION(S)

This application is a National Stage of International Application No. PCT/KR2021/011955 filed Sep. 3, 2021, claiming priority based on Korean Patent Application No. 10-2020-0124115 filed Sep. 24, 2020, the disclosure of which is incorporated herein by reference in its entirety.

FIELD OF THE INVENTION

The present invention relates to an ingot growing apparatus.

DISCUSSION OF RELATED ART

Single-crystal silicon is used as a basic material for most semiconductor devices, and such materials are manufactured as single crystals having high purity. One such manufacturing methods is the Czochralski method.

As illustrated in FIG. 1, in the Czochralski method, a solid silicon material is input to a crucible 30 in a chamber 10, and the crucible 30 is heated using a heating element 20 to melt silicon. In addition, when a single crystal seed S is moved upward and rotated at the same time using a wire W in a state in which the single crystal seed S is in contact with the molten silicon, an ingot having a predetermined diameter is grown.

A continuous Czochralski (CCz) method which is one of such Czochralski methods, is a method of continuously growing an ingot while replenishing consumed molten silicon in a crucible by continuously injecting solid polysilicon or molten silicon into the crucible.

As illustrated in FIG. 1, when a first convective region A1 in which a single crystal of an ingot I is grown is replenished with silicon, there is a problem that a single crystal yield of the ingot decreases due to a change in temperature in the first convective region A1.

That is, there is a need for studies on supplying silicon to a second convective region A2 close to a side surface of a crucible 30 to minimize a change in temperature in the first convective region A1.

SUMMARY OF THE INVENTION

The present invention is directed to providing an ingot growing apparatus in which a change in temperature for growing a single crystal of an ingot is minimized to increase a yield of the single crystal while molten silicon is supplied to a crucible.

According to an aspect of the present invention, there is provided an ingot growing apparatus including a growth furnace in which a main crucible is disposed, wherein the main crucible accommodates molten silicon and is rotated clockwise or counterclockwise to rotate the molten silicon clockwise or counterclockwise in order to grow an ingot, a susceptor formed to surround an outer surface of the main crucible and rotated in the same direction as the main crucible, and a preliminary melting unit which receives a solid silicon material, melts the solid silicon material into molten silicon, and supplies the molten silicon to the main crucible, wherein the preliminary melting unit includes a preliminary crucible which accommodates the molten silicon, and the preliminary crucible supplies the molten silicon contained in the preliminary crucible to the main crucible in a direction in which the molten silicon contained in the main crucible rotates.

The molten silicon contained in the preliminary crucible may be provided to the main crucible in the range of −20° to +70° in a tangential direction of a direction in which the molten silicon contained in the main crucible rotates.

The preliminary crucible may include a body of which an upper side is open and which includes a sidewall in which an opening is formed and a beak extending in the tangential direction from the sidewall of the body.

An end portion of the beak of the preliminary crucible may be formed to be disposed close to an inclined surface of the main crucible or a boundary line at which the molten silicon is in contact with the inclined surface.

The molten silicon contained in the main crucible may be divided into a first convective region in which the ingot grows and a second convective region which surrounds the first convective region, and an end portion of the beak of the preliminary crucible may be disposed close to the second convective region and farthest from the first convective region.

The preliminary crucible may be movably formed between a first position at which the molten silicon is contained in the body of the preliminary crucible and a second position at which the molten silicon contained in the body flows out to the main crucible, and the preliminary melting unit may include a preliminary crucible moving module which moves the preliminary crucible between the first position and the second position.

The preliminary melting unit may include a preliminary susceptor formed to support the preliminary crucible.

The preliminary crucible moving module may include a support member which supports the preliminary susceptor so that the beak of the preliminary crucible facing the main crucible is rotatably tilted and a lifter which moves one side of the body of the preliminary crucible upward or downward.

The support member may be disposed to be spaced apart from the main crucible so as not to interfere with the main crucible.

The support member may be formed in a pin shape extending upward, an upper surface of the support member may be formed as a curved surface, and a support groove in contact with the support member may be formed in a lower surface of the preliminary susceptor to accommodate the upper surface of the support member.

The support groove may be formed not to overlap the main crucible when viewed from above the main crucible.

An end portion of the beak of the preliminary crucible may be formed to be disposed close to an upper surface of the main crucible when viewed from above the main crucible.

The opening of the preliminary crucible may be formed in a lowermost end of a central portion of a sidewall of the preliminary crucible, and the beak of the preliminary crucible may be formed to be disposed at a position corresponding to the opening.

According to another aspect of the present invention, there is provided an ingot growing apparatus including a growth furnace in which a main crucible is disposed, wherein the main crucible accommodates molten silicon and is rotated clockwise or counterclockwise to rotate the molten silicon clockwise or counterclockwise in order to grow an ingot, a susceptor formed to surround an outer surface of the main crucible and rotated in the same direction as the main crucible, and a preliminary melting unit which receives a solid silicon material, melts the solid silicon material into molten silicon, and supplies the molten silicon to the main crucible, wherein a preliminary melting unit includes a preliminary crucible which accommodates the molten silicon, and the preliminary crucible is disposed to supply the molten silicon contained in the preliminary crucible to the main crucible in a rotation direction of the main crucible.

BRIEF DESCRIPTION OF THE DRAWINGS

Not only detailed descriptions of exemplary embodiments of the present invention described below but also the summary described above will be understood more easily when read with reference to the accompanying drawings. The exemplary embodiments are illustrated in the drawings to illustrate the present invention. However, it should be understood that the present invention is not limited to the exact layout and method illustrated in the drawings, in which.

DETAILED DESCRIPTION OF EXEMPLARY EMBODIMENTS

Terms and words used in this specification and claims should not be interpreted as limited to commonly used meanings or meanings in dictionaries and should be interpreted with meanings and concepts which are consistent with the technological scope of the present invention based on the principle which the inventors have appropriately defined concepts of terms in order to describe the invention in the best way.

Therefore, since the embodiments described in this specification and configurations illustrated in the accompanying drawings are only exemplary embodiments and do not represent the overall technological scope of the invention, the corresponding configurations may have various equivalents and modifications which can substitute for the configurations at the time of filing of this application.

It should be understood which the terms "comprise," "include," or the like, when used herein, specify the presence of stated features, numbers, operations, elements, components, or groups thereof but do not preclude the presence or addition of one or more other features, numbers, operations, elements, components, or groups thereof.

Unless there are special circumstances, a case in which a component is disposed "in front of," "behind," "above," or "under" another component includes not only a case in which the component is disposed directly "in front of,"

"behind," "above," or "under" another component, but also a case in which still another component is interposed therebetween. Unless there are special circumstances, a case in which some components are connected to each other includes not only a case in which the components are directly connected to each other, but also a case in which the components are indirectly connected to each other.

Hereinafter, an ingot growing apparatus according to an embodiment of the present invention will be described with reference to the accompanying drawings. In describing the ingot growing apparatus according to the embodiment of the present invention, components which are not related to a content of the invention will not be illustrated in detail or will be omitted for simplification of the accompanying drawings, and the ingot growing apparatus according to the present invention will be described mainly based on the content related to the spirit of the invention.

In this specification, an arrow direction of a Z axis is referred to as an upward direction of a growth furnace. A downward direction is an opposite direction of the upward direction.

Figure 1:
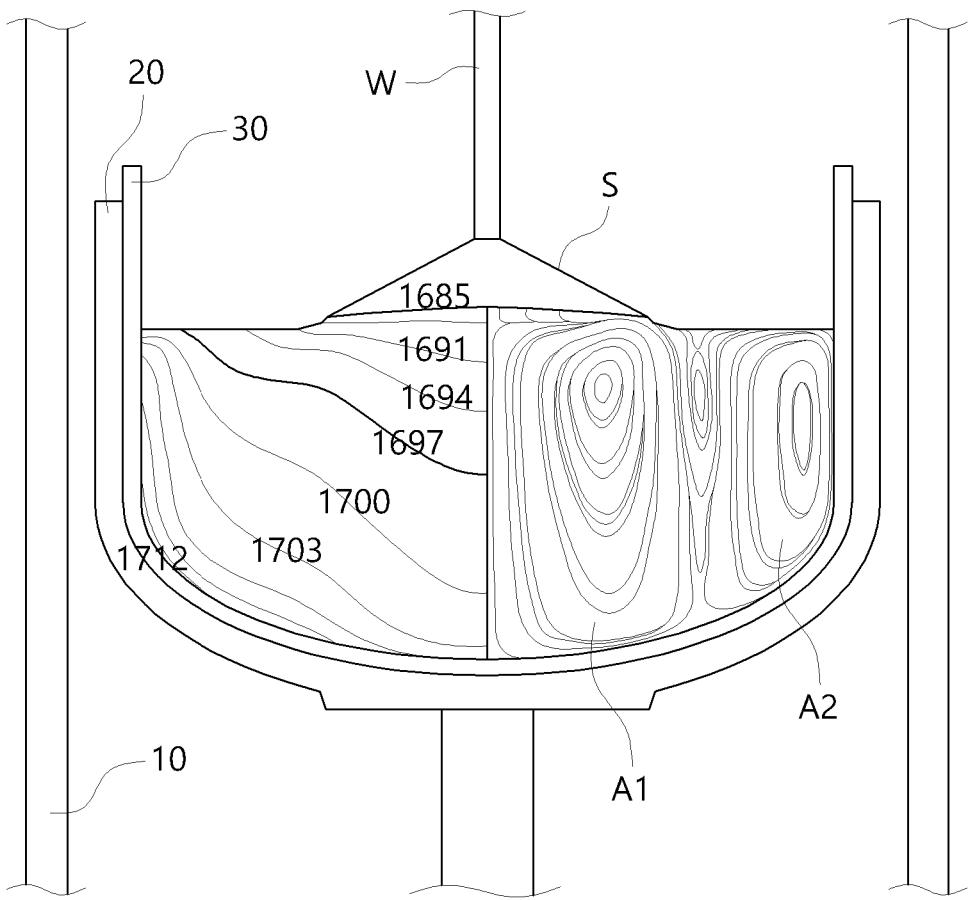
FIG. 1 is a schematic view illustrating a conventional ingot growing apparatus.
Figure 2:
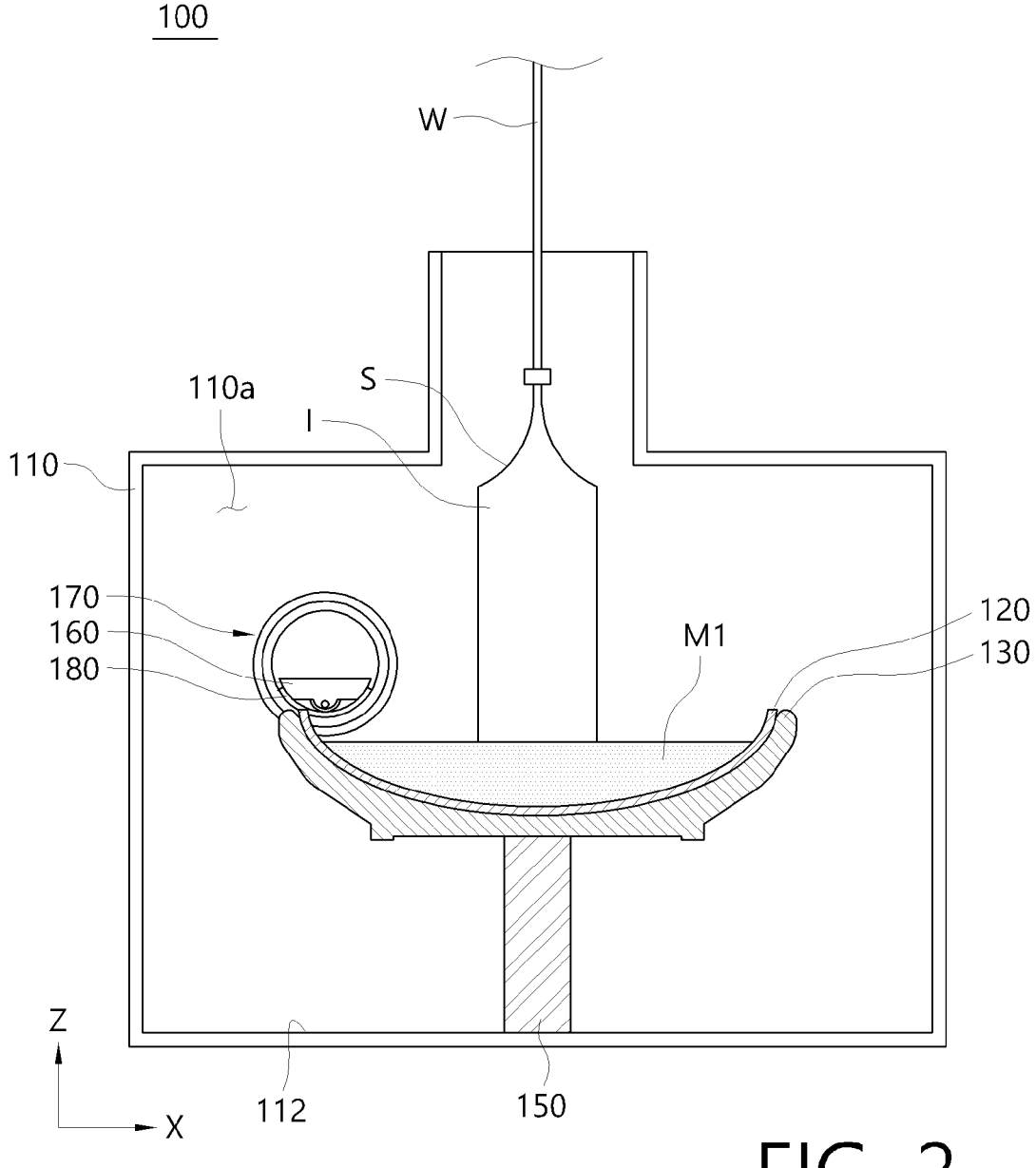
FIG. 2 is a schematic view illustrating an ingot growing apparatus according to an embodiment of the present invention.

FIG. 2 is a schematic view illustrating an ingot growing apparatus according to an embodiment of the present invention.

Referring to FIG. 2, an ingot growing apparatus 100 according to the embodiment of the present invention may include a growth furnace 110, a main crucible 120, and a preliminary melting unit 160.

The growth furnace 110 is formed to have an inner space 110a maintained in a vacuum state, and an ingot I is grown in the inner space 110a. In the inner space 110a, the main crucible 120, which will be described below, is disposed.

The growth furnace 110 includes a vacuum pump (not shown) and an inert gas supply unit (not shown). The vacuum pump may maintain the inner space 110a in a vacuum atmosphere. In addition, the inert gas supply unit supplies an inert gas to the inner space 110a. The inert gas may be, for example, argon (Ar).

The main crucible 120 is accommodated in the inner space 110a of the growth furnace 110. The main crucible 120 may accommodate molten silicon M1. In addition, the main crucible 120 is generally formed in a reverse dome shape. In addition, the main crucible 120 is not limited to being formed in the reverse dome shape, and may be formed in various shapes such as a cylinder shape.

In addition, the main crucible 120 is formed of a quartz material. However, the main crucible 120 is not limited to the quartz material, and may be formed of any material which has heat resistance at a temperature of about 1400° C. or higher and withstands a sudden change in temperature.

In addition, in a state in which a single crystal seed S is in contact with the molten silicon M1 contained in the main crucible 120, when a wire W connected to an upper side of the growth furnace 110 pulls the single crystal seed S in an upward direction (Z axis), the ingot I having a predetermined diameter is grown in the direction (Z axis) in which the ingot I is pulled upward.

A susceptor 130 surrounds an outer surface of the main crucible 120. The susceptor 130 supports the main crucible 120. An inner surface of the susceptor 130 is formed in a shape corresponding to the outer surface of the main crucible 120. For example, when the main crucible 120 has the reverse dome shape, the susceptor 130 also has a reverse dome shape. The susceptor 130 is formed of a graphite material. In addition, the susceptor 130 is not limited to being formed of the graphite material, and may be formed of any material having high heat resistance and conductivity.

Accordingly, even when the main crucible 120 is formed of the quartz material and deformed at a high temperature, the susceptor 130 surrounds and supports the main crucible 120 to maintain a state in which the main crucible 120 accommodates the molten silicon M1.

In addition, a susceptor support 150, which supports the susceptor 130, is disposed on a lower surface 112 of the growth furnace 110. An upper end of the susceptor support 150 is formed in a shape corresponding to a lower end of the susceptor 130. In addition, in a state in which the susceptor support 150 supports the susceptor 130 at a lower side of the growth furnace 110, the susceptor support 150 is rotated in the same direction as the susceptor 130. Accordingly, in a state in which the main crucible 120 accommodates the molten silicon M1, the main crucible 120 is rotated in the same direction as the susceptor 130.

In addition, the growth furnace 110 includes a driving unit (not shown) which provides a rotational force to rotate the susceptor support 150. The susceptor support 150 is rotatably connected to the driving unit. When the driving unit receives power and provides a rotational force to the susceptor support 150, the main crucible 120 is rotated in the same direction as the susceptor 130.

In addition, the growth furnace 110 includes a heater (not shown) which heats the susceptor 130. The heater includes a coil which receives power to generate a magnetic field and a shield which surrounds the coil.

The coil is formed to surround an outer surface of the susceptor. The coil receives the power to generate the magnetic field. In addition, a current is generated in the susceptor 130 due to electromagnetic induction of the magnetic field of the coil. In this case, the current generated in the susceptor 130 is converted into thermal energy. Accordingly, the heater heats the susceptor 130. The heat of the susceptor 130 is thermally conducted to the main crucible 120, and thus the susceptor 130 heats the main crucible 120.

The shield supports the coil to maintain a predetermined shape of the coil. The shield is formed of a ceramic. The shield prevents the coil from being exposed to the inner space 110a of the growth furnace 110. Accordingly, since the shield prevents the coil from being exposed to the inner space 110a of the growth furnace 110, when the coil receives the power to generate the magnetic field, generation of an arc discharge due to a plasma phenomenon in the vacuum state is prevented, or generation of an arc discharge caused by the coil coming into contact with the inert gas (for example, argon) present in the inner space 110a is prevented.

In addition, the heater is not limited to operating in an induction heating manner which generates the magnetic field, and may operate in a resistance heating manner which receives power to be directly heated.

The preliminary melting unit 160 receives a solid silicon material and melts the solid silicon material into molten silicon. In addition, the preliminary melting unit 160 includes a preliminary crucible 170 which accommodates the molten silicon.

In addition, the preliminary crucible 170 is formed of a quartz material. However, the preliminary crucible 170 is not limited to being formed of the quartz material, and may be formed of any material which has heat resistance at a temperature of about 1400° C. or higher and withstands a sudden change in temperature.

In addition, the preliminary crucible 170 supplies the molten silicon to the main crucible 120. The preliminary crucible 170 will be described in detail below with reference to the accompanying drawings.

In addition, the preliminary melting unit 160 includes a preliminary susceptor 180 formed to support the preliminary crucible 170.

In addition, the preliminary susceptor 180 is formed of a graphite material. In addition, the preliminary susceptor 180 is not limited to being formed of the graphite material, and may be formed of any material having high heat resistance and conductive properties.

In addition, a quantitative supply unit (not shown) which supplies the solid silicon material to the preliminary crucible 170 is provided outside the growth furnace 110.

The quantitative supply unit measures a weight of the solid silicon material. Accordingly, the quantitative supply unit may supply a required amount of the solid silicon material to the preliminary crucible 170 to estimate an amount of the molten silicon accommodated in the preliminary crucible 170.

Figure 3A:
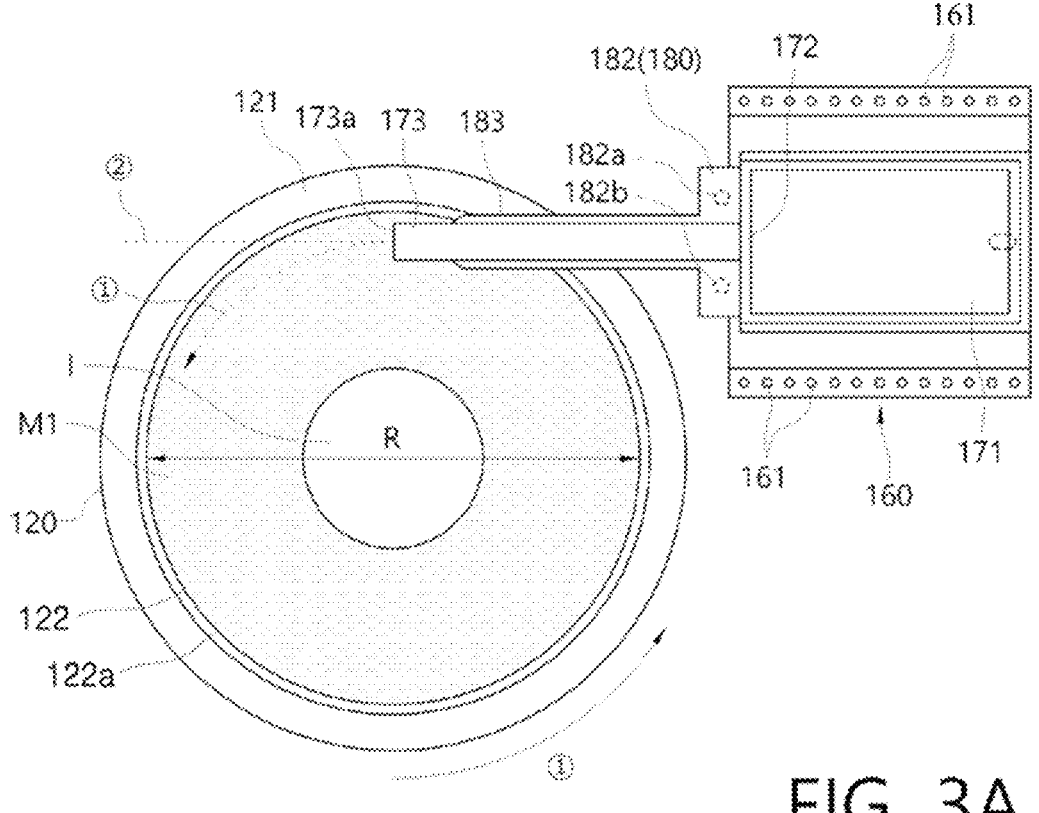
FIG. 3A is a view mainly illustrating a main crucible and a preliminary melting unit of FIG. 2.
Figure 3B:
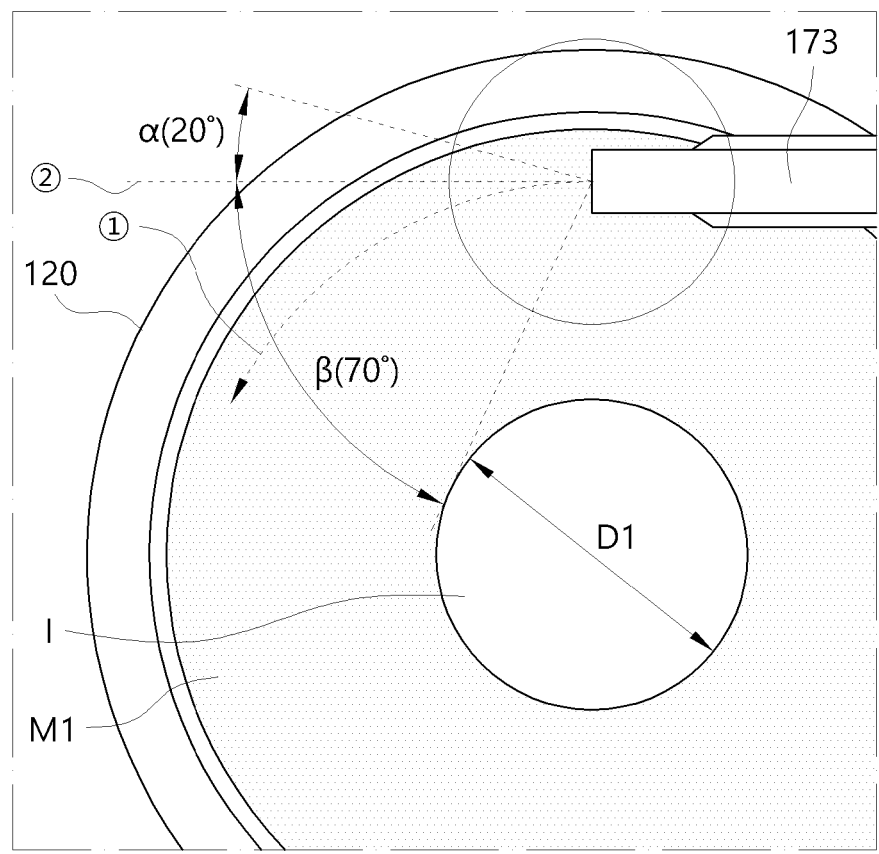
FIG. 3B is a view illustrating a direction in which molten silicon is supplied.
Figure 3C:
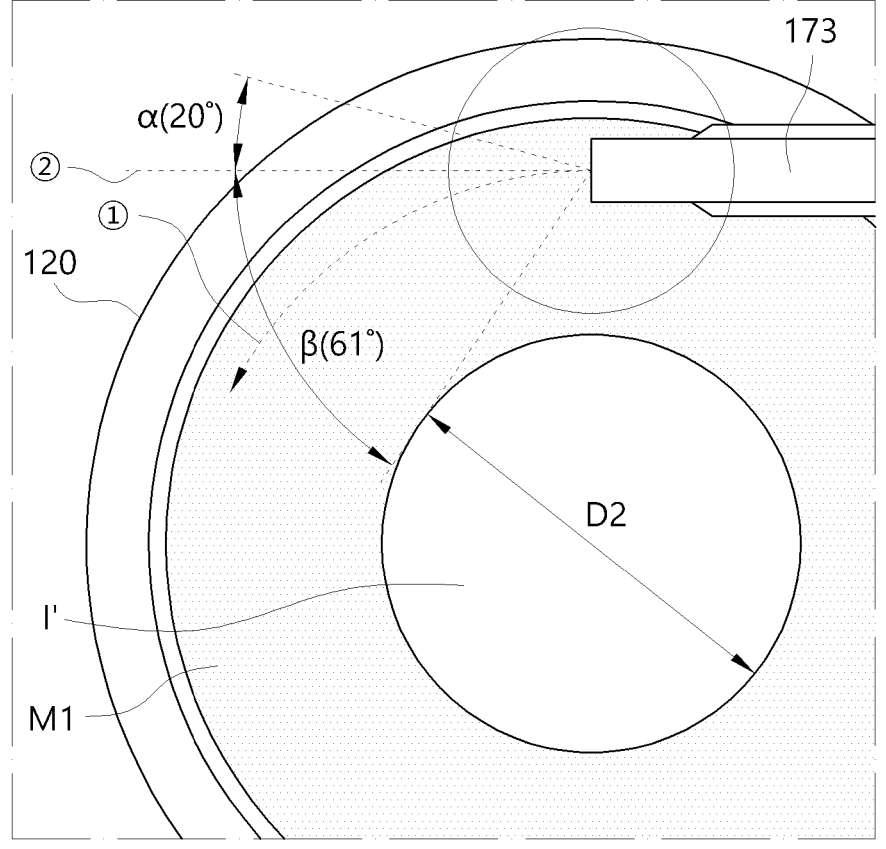
FIG. 3C is a view illustrating a direction in which molten silicon is supplied according to various embodiments of the present invention.
Figure 4:
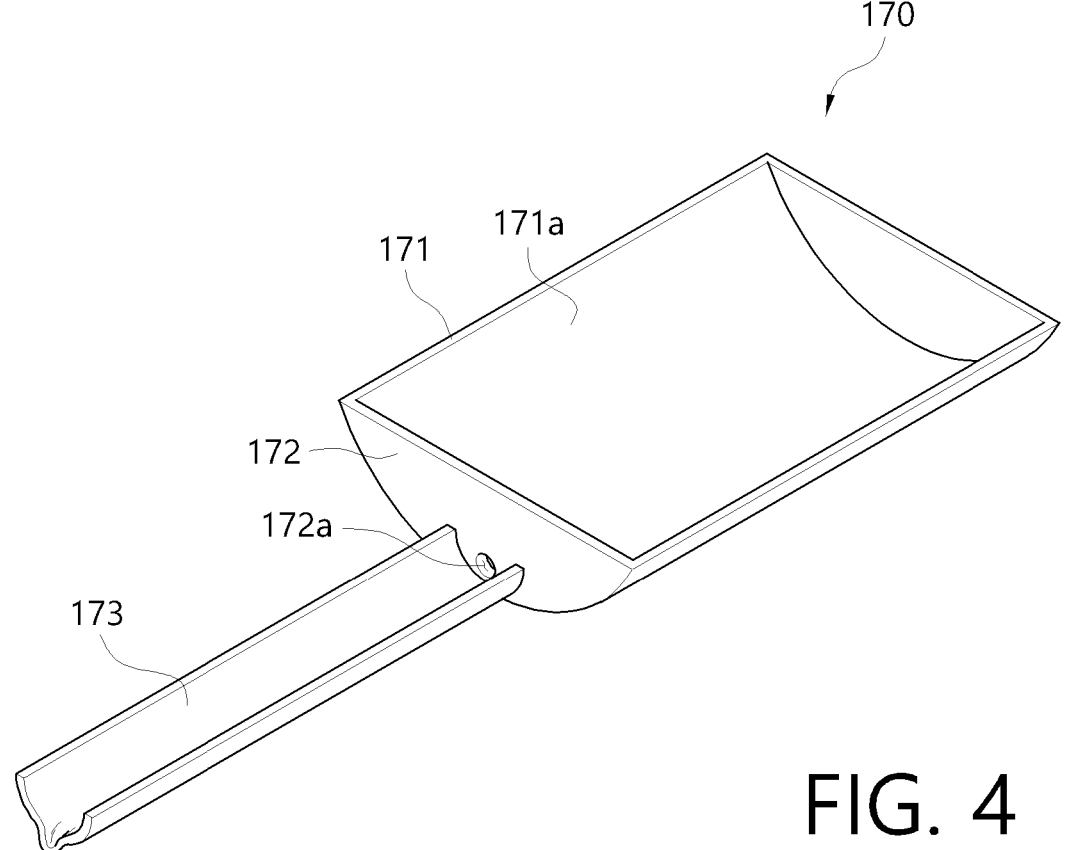
FIG. 4 is a perspective view illustrating a preliminary crucible of FIG. 3A.

FIG. 3A is a view mainly illustrating the main crucible and the preliminary melting unit of FIG. 2, FIG. 3B is a view illustrating a direction in which the molten silicon is supplied, and FIG. 3C is a view illustrating a direction in which the molten silicon is supplied according to various embodiments of the present invention. FIG. 4 is a perspective view illustrating the preliminary crucible of FIG. 3A.

Referring to FIGS. 3A to 3C and 4, the main crucible 120 is rotated in a clockwise or counterclockwise direction which is a rotation direction ①. In addition, the preliminary crucible 170 is disposed to supply the molten silicon contained in the preliminary crucible 170 to the main crucible 120 in the rotation direction ① of the main crucible 120.

In addition, according to the embodiment of the present invention, the molten silicon contained in the main crucible 120 is rotated in a direction the same as the rotation direction ① of the main crucible 120. In addition, the preliminary crucible 170 supplies the molten silicon contained in the preliminary crucible 170 to the main crucible 120 in the rotation direction ① of the molten silicon contained in the main crucible 120.

The preliminary crucible 170 includes a body 171 having an open upper side and a beak 173 extending from the body 171.

The body 171 is formed in a substantially semicylindrical shape. The body 171 includes a sidewall 172 in which an opening 172a is formed. The opening 172a of the body 171 is formed at a lowermost end of a central portion of the sidewall 172 of the body 171. As an example, a diameter of the opening 172a is about 10 mm but is not limited thereto and may have any size.

The beak 173 extends from the sidewall 172 of the body 171. In addition, the beak 173 is formed to be disposed at a position corresponding to the opening 172a. Accordingly, the molten silicon accommodated in the body 171 passes through the opening 172a and is guided to move by the beak 173.

An end portion 173a of the beak 173 is formed close to an inclined surface 122 inside the main crucible 120 or close to a boundary line 122a at which the molten silicon M1 is in contact with the inclined surface 122.

In addition, according to the embodiment of the present invention, the molten silicon M1 contained in the main crucible 120 is divided into a first convective region A1 in which the ingot I is grown and a second convective region A2 surrounding the first convective region A1. In this case, the end portion 173a of the beak 173 is formed to be disposed close to the second convective region A2 and farthest from the first convective region A1.

In addition, as illustrated in FIG. 3A, the end portion 173a of the beak 173 is formed to be disposed close to an upper surface 121 of the main crucible 120 when viewed from above the main crucible 120.

Meanwhile, when the susceptor 130 (see FIG. 2) is rotated in the clockwise or counterclockwise direction, which is the rotation direction ①, the main crucible 120 is rotated in the clockwise or counterclockwise direction, which is the rotation direction ① that is the same rotation direction of the susceptor 130 (see FIG. 2). In addition, the molten silicon M1 accommodated in the main crucible 120 is also rotated in the clockwise or in the counterclockwise direction which is the rotation direction ①.

According to the embodiment of the present invention, the beak 173 is formed parallel to a tangential direction ② of the clockwise direction or the counterclockwise direction which is the rotation direction ① in which the molten silicon M1 in the main crucible 120 is rotated. That is, the beak 173 extends from the sidewall 172 of the body 171 in the tangential direction ②. The beak 173 allows the preliminary crucible 170 to be connected to an inner portion of the main crucible 120 which is closest to the upper surface 121 of the main crucible 120 so as to prevent the molten silicon in the preliminary crucible 170 from splashing out of the main crucible 120, prevent the molten silicon from changing the single crystal growth temperature of the ingot I, and also prevent a wave from being generated on the molten silicon M1 from which the ingot I is grown.

In addition, a length of the beak 173 is determined according to a separation distance between the main crucible 120 and the preliminary melting unit 160. In addition, the length of the beak 173 may be determined according to a length of an inner diameter of the main crucible 120.

Accordingly, the preliminary crucible 170 supplies the molten silicon in the preliminary crucible 170 to the main crucible 120 in the tangential direction ② of the clockwise direction or the counterclockwise direction which is the rotation direction ① in which the molten silicon M1 in the main crucible 120 is rotated.

In addition, the molten silicon contained in the preliminary crucible 170 and supplied to the main crucible 120 is naturally added to the molten silicon M1 in the main crucible 120 rotated in the clockwise or counterclockwise direction which is the rotation direction ①, and thus the phenomenon in which the molten silicon splashes is prevented.

In addition, according to various embodiments of the present invention, as illustrated in FIG. 3B, the molten silicon contained in the preliminary crucible 170 may be provided to the main crucible 120 in the range of an angle α of −20° to an angle β of +70° with respect to the tangential direction ② of the rotation direction ① of the molten silicon contained in the main crucible 120. In this case, when a diameter R of the main crucible 120 is approximately 657 mm and a diameter D1 of the ingot I is 214 mm, the angle β of +70° is an angle between a tangential direction of an outer surface of the ingot I and the tangential direction of the direction ② in which the molten silicon M1 is rotated.

When the molten silicon contained in the preliminary crucible 170 is supplied to the main crucible 120 outside the angle α of −20° with respect to the tangential direction ②, there is a problem that the molten silicon contained in the preliminary crucible 170 splashes to the outside of the main crucible 120. Meanwhile, when the molten silicon contained in the preliminary crucible 170 is supplied to the main crucible 120 outside the angle β of +70° with respect to the tangential direction ②, there is a problem that the molten silicon contained in the preliminary crucible 170 causes a wave to be generated on the molten silicon M1 in which the ingot I is grown. That is, since the molten silicon contained in the preliminary crucible 170 is provided to the main crucible in the range of the angle α of −20° to the angle β of +70° with respect to the tangential direction ② of the rotation direction ① of the molten silicon contained in the main crucible 120, the wave is prevented from being generated on the molten silicon M1 from which the ingot I is grown, and the phenomenon of splashing to the outside of the main crucible 120 is prevented.

In addition, according to various embodiments of the present invention, as illustrated in FIG. 3C, the molten silicon contained in the preliminary crucible 170 may be provided to the main crucible in the range of the angle α of −20° to an angle β of +61° with respect to the tangential direction ② of the rotation direction ① of the molten silicon contained in the main crucible 120. In this case, when the diameter R of the main crucible 120 is approximately 657 mm and a diameter D2 of an ingot I' is 300 mm, the angle β of +61° is an angle between a tangential direction of an outer surface of the ingot I' and the tangential direction ② of the direction in which molten silicon M1 is rotated.

In addition, as illustrated in FIG. 3A, the end portion 173a of the beak 173 is formed to be disposed close to the upper surface 121 of the main crucible 120 when viewed from above the main crucible 120. Accordingly, the beak 173 supplies the molten silicon at a position farthest from the ingot I in the main crucible 120.

Accordingly, as the preliminary crucible 170 supplies the molten silicon to the main crucible 120 so that a change in temperature of a region in which the ingot I is grown is minimized, a yield of the single crystal of the ingot I can be increased.

Meanwhile, the body 171 is formed so that a distance between inner surfaces disposed opposite to each other in the body 171 is gradually reduced. Accordingly, the body 171 accommodates a predetermined amount or more of the molten silicon between the inner surfaces of the body 171 and also allows the molten silicon to be smoothly moved through the opening 172a, and thus the molten silicon in the preliminary crucible 170 is prevented from being rapidly solidified.

In addition, according to various embodiments of the present invention, a cross-section of the body 171 may be formed in a shape in which a distance between the inner surfaces disposed to face each other decreases at a predetermined rate, for example, a "V" shape.

In this case, as illustrated in FIG. 3A, the preliminary susceptor 180 includes a first support 182 which supports the body 171 and a second support 183 which supports the beak 173.

The first support 182 includes a portion which supports the body 171 and protrudes toward the main crucible 120 from the sidewall 172.

Support grooves 182a and 182b, which will be described below, are formed in the protruding portion of the first support 182. The support grooves 182a and 182b do not overlap the main crucible 120 when viewed from above the main crucible 120.

In addition, the preliminary melting unit 160 includes a preliminary heater 161 which heats the preliminary susceptor 180 in an electromagnetic induction manner.

The preliminary heater 161 is formed in a coil shape which receives power to generate a magnetic field. The preliminary heater 161 is formed to surround the preliminary crucible 170 and the preliminary susceptor 180. A current is generated in the preliminary susceptor 180 due to electromagnetic induction due to the magnetic field of the preliminary heater 161. In this case, the current generated in the preliminary susceptor 180 is converted into thermal energy. Accordingly, the preliminary heater 161 heats the preliminary susceptor 180. The heat of the preliminary susceptor 180 is thermally conducted to the preliminary crucible 170, and the preliminary susceptor 180 heats the preliminary crucible 170.

Figure 5:
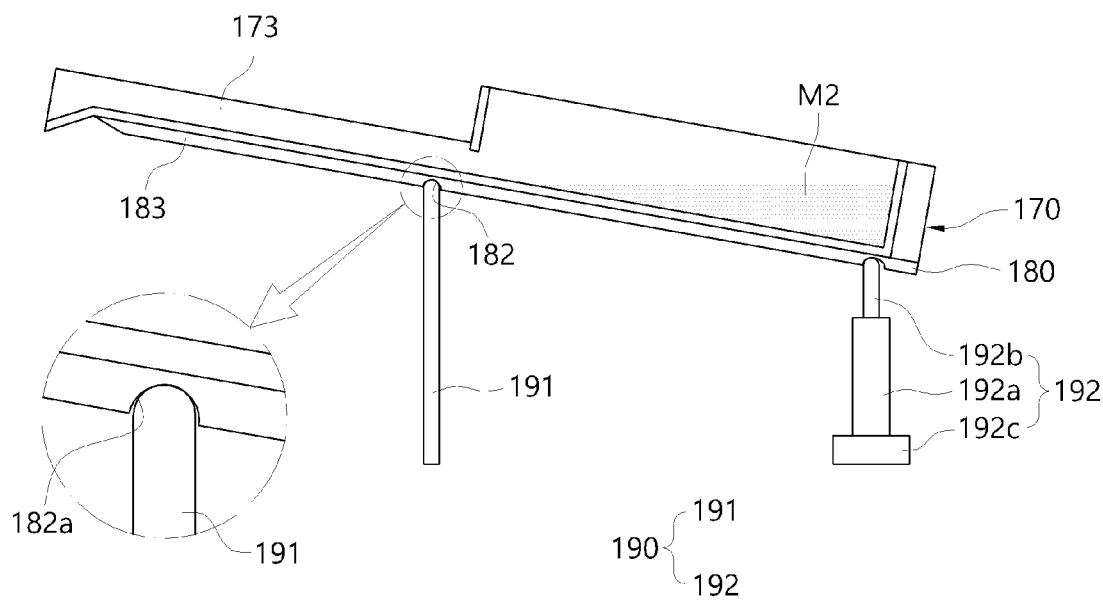
FIG. 5 is a view illustrating a preliminary crucible moving module which moves the preliminary crucible.
Figure 6:
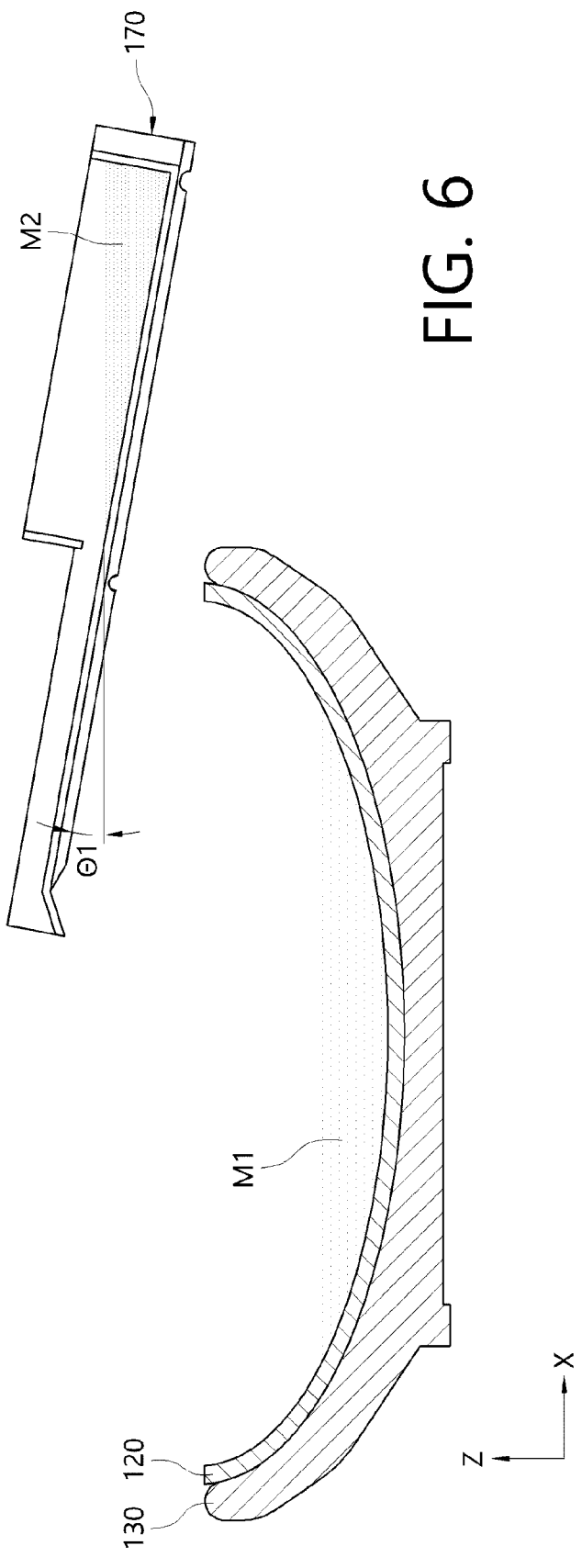
FIG. 6 is a view illustrating a state in which the preliminary crucible is at a first position.
Figure 7:
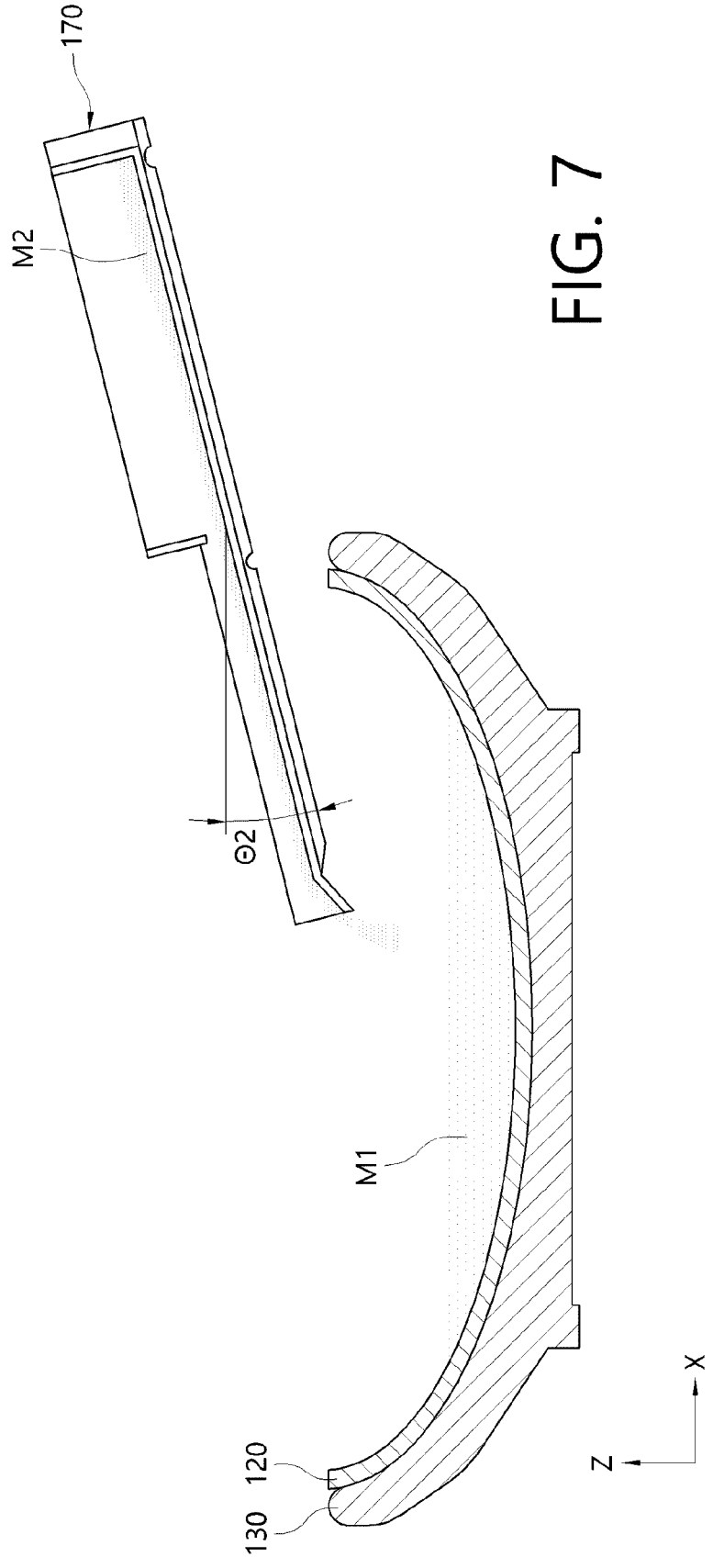
FIG. 7 is a view illustrating a state in which the preliminary crucible is at a second position.

FIG. 5 is a view illustrating a preliminary crucible moving module which moves the preliminary crucible, FIG. 6 is a view illustrating a state in which the preliminary crucible is at a first position, and FIG. 7 is a view illustrating a state in which the preliminary crucible is at a second position.

The preliminary crucible 170 is rotatably provided between the first position at which the molten silicon M2 is contained in the preliminary crucible 170 and the second position at which the molten silicon M2 flows out to the main crucible 120.

In this case, as illustrated in FIG. 6, when the preliminary crucible 170 is disposed at the first position, the preliminary crucible 170 is tilted at a first angle θ1. In addition, as illustrated in FIG. 7, when the preliminary crucible 170 is disposed at the second position, the preliminary crucible 170 is tilted at a second angle θ2.

In order for the preliminary crucible 170 to be rotated between the first position and the second position, a preliminary crucible moving module 190 which tilts the preliminary crucible 120 is provided at a lower side of the preliminary susceptor 180.

The preliminary crucible moving module 190 includes a support member 191 which supports the preliminary susceptor 180 and a lifter 192 which moves one side of the body 171 of the preliminary crucible 170 upward or downward.

In this case, the support member 191 supports the preliminary susceptor 180 so that the beak 173 of the preliminary crucible 170 facing the main crucible 120 is rotatably tilted. In addition, the support member 191 is formed in a pin shape extending upward. In addition, an upper surface of the support member 191 is formed as a curved surface.

Meanwhile, a support groove 182a in contact with the support member is formed in a lower surface of the first support 182 of the preliminary susceptor 180 to accommodate the upper surface of the support member 191. As illustrated in FIG. 3A, the support groove 182a is provided as a plurality of support grooves 182a. In addition, the support member 191 is provided as a plurality of support members 191 so that each of the plurality of support members 191 is in contract with one of the plurality of support grooves 182a and 182b (see FIG. 3A).

The lifter 192 is provided to support the preliminary susceptor 180 at a point spaced apart from the support groove 182a. Accordingly, the plurality of support members 191 and the lifter 192 support the preliminary susceptor 180 at three points, and thus the preliminary susceptor 180 and the preliminary crucible 170 are stably supported.

In this case, as illustrated in FIG. 5, the lifter 192 includes a cylinder 192a, a piston 192b, and a lifter driving unit 192c.

The cylinder 192a has a piston accommodation space in which the piston 192b is accommodated. The piston 192b may be moved in a vertical direction (Z axis) along the piston accommodation space. An upper surface of the piston 192b is formed as a curved surface.

The lifter driving unit 192c provides a driving force so that the piston 192b is moved in the vertical direction. In this case, the lifter driving unit 192c may provide a driving force to the piston 192b in a hydraulic manner or may be implemented in a structure of a motor and a gear to provide a driving force to the piston 192b. In addition, the lifter driving unit 192c may provide a driving force to the piston 192b using any structure and in any manner in addition thereto.

When the piston 192b is moved in the upward direction (Z axis), in a state in which the preliminary susceptor 180 is supported by the support member 191, the second support 183 of the susceptor 180 is tilted toward the main crucible 120. In addition, since the preliminary crucible 170 is supported by the preliminary susceptor 180, the beak 173 is tilted toward the main crucible 120. Accordingly, the molten silicon M2 is moved along the beak 173 and flows down to the main crucible 120.

When a required amount of the molten silicon M2 is supplied to the main crucible 120, the piston 192b is moved downward. In addition, in a state in which the preliminary crucible 170 is supported by the support member 191, the beak 173 is tilted in the upward direction which is a direction away from the main crucible 120. Accordingly, the preliminary crucible 170 stops supplying the molten silicon M2 to the main crucible 120.

In addition, as illustrated in FIG. 3A, the support grooves 182a and 182b are formed not to overlap the main crucible 120 when viewed from above the main crucible 120. Accordingly, the support member 191 in contact with each of the support grooves 182a and 182b is disposed to be spaced apart from the main crucible 120 and thus does not interfere with the main crucible 120 and the susceptor 130.

In an ingot growing apparatus according to an embodiment of the present invention, since molten silicon contained in a preliminary crucible is supplied in a direction in which molten silicon accommodated and rotated in a main crucible is rotated, a change in temperature of the molten silicon contained in the main crucible is minimized, and thus a yield of a single crystal of an ingot can be increased.

In addition, since a preliminary crucible moving module is disposed to be spaced apart from a main crucible, the preliminary crucible moving module can move a preliminary crucible without interfering with the main crucible.

While embodiments of the present invention have been described above, the spirit of the present invention is not limited to the embodiments proposed in this specification. Other embodiments may be easily suggested by adding, changing and removing components by those skilled in the art understanding the spirit of the present invention and will fall within the spirit and scope of the present invention.

What is claimed is:

1. An ingot growing apparatus comprising:
a growth furnace in which a main crucible is disposed, wherein the main crucible accommodates molten silicon and is rotated clockwise or counterclockwise to rotate the molten silicon clockwise or counterclockwise in order to grow an ingot;
a susceptor formed to surround an outer surface of the main crucible and rotated in the same direction as the main crucible; and
a preliminary melting unit which receives a solid silicon material, melts the solid silicon material into molten silicon, and supplies the molten silicon to the main crucible,
wherein the preliminary melting unit includes:
a preliminary crucible which accommodates the molten silicon,
the preliminary crucible including:
a body of which an upper side is open and which includes a sidewall in which an opening is formed; and a beak extending from the sidewall of the body in a tangential direction corresponding to a rotation direction of the molten silicon in the main crucible, and a preliminary susceptor including a first support configured to support the body and a second support extending in the same direction as the beak and configured to support the beak, and a distal end of the beak extending farther than a distal end of the second support.

2. The ingot growing apparatus of claim 1, wherein the molten silicon contained in the preliminary crucible is provided to the main crucible at an angle within a range of −20° to +70° relative to the tangential direction.

3. The ingot growing apparatus of claim 2, wherein an end portion of the beak of the preliminary crucible is disposed at a radial-position spaced in a radial direction from a center of the main crucible toward a periphery where an inclined surface is located, the end portion being radially inward of the inclined surface with respect to the center of the main crucible.

4. The ingot growing apparatus of claim 2, wherein:

the molten silicon contained in the main crucible is divided into a first convective region in which the ingot grows and a second convective region which surrounds the first convective region; and an end portion of the beak of the preliminary crucible is disposed at a position spaced in a radial direction from a center of the main crucible above the second convective region, the position being farthest from the first convective region.

5. The ingot growing apparatus of claim 1, wherein:

the preliminary crucible is movably formed between a first position at which the molten silicon is contained in the body of the preliminary crucible and a second position at which the molten silicon contained in the body flows out to the main crucible; and the preliminary melting unit includes a preliminary crucible moving module which moves the preliminary crucible between the first position and the second position.

6. The ingot growing apparatus of claim 5, wherein the preliminary crucible moving module includes:

a support member which supports the preliminary susceptor so that the beak of the preliminary crucible facing the main crucible is rotatably tilted; and a lifter which moves one side of the body of the preliminary crucible upward or downward.

7. The ingot growing apparatus of claim 6, wherein the support member is disposed to be spaced apart from the main crucible so as not to interfere with the main crucible.

8. The ingot growing apparatus of claim 6, wherein:

the support member is formed in a pin shape extending upward;

an upper surface of the support member is formed as a curved surface; and a support groove in contact with the support member is formed in a lower surface of the preliminary susceptor to accommodate the upper surface of the support member.

9. The ingot growing apparatus of claim 8, wherein the support groove is formed not to overlap the main crucible when viewed from above the main crucible.

10. The ingot growing apparatus of claim 1, wherein an end portion of the beak of the preliminary crucible is formed to be disposed at a position spaced in a radial direction from a center of the main crucible toward a periphery where an upper surface of the main crucible is located, the end portion being radially inward of the upper surface with respect to the center of the main crucible.

11. The ingot growing apparatus of claim 1, wherein:

the opening of the preliminary crucible is formed in a lowermost end of a central portion of the sidewall of the preliminary crucible; and the beak of the preliminary crucible is formed to be disposed at a position corresponding to the opening.

* * * * *